(12) United States Patent
Weston et al.

(10) Patent No.: US 7,619,471 B2
(45) Date of Patent: Nov. 17, 2009

(54) CLASS D AMPLIFIER WITH INCREASED EFFICIENCY

(75) Inventors: Lance Weston, East Northport, NY (US); Tony T Li, Roslyn Heights, NY (US); John J Ryan, Seaford, NY (US)

(73) Assignee: Honeywell International, Inc., Morristown, NJ (US)

(*) Notice: Subject to any disclaimer, the term of this patent is extended or adjusted under 35 U.S.C. 154(b) by 100 days.

(21) Appl. No.: 11/831,941

(22) Filed: Jul. 31, 2007

(65) Prior Publication Data

US 2009/0033419 A1 Feb. 5, 2009

(51) Int. Cl.
*H03F 3/217* (2006.01)
(52) U.S. Cl. .................................. 330/251; 330/207 A
(58) Field of Classification Search ................... 330/10, 330/207 A, 251
See application file for complete search history.

(56) References Cited

U.S. PATENT DOCUMENTS 7,026,866 B2 * 4/2006 Llewellyn ................... 330/10

2008/0111620 A1 * 5/2008 Menard et al. ............... 330/10

* cited by examiner

*Primary Examiner*—Khanh V Nguyen
(74) *Attorney, Agent, or Firm*—Barkume & Associates, P.C.

(57) ABSTRACT

The present invention is a method of operating a speaker by converting an audio signal to a pulse-width modulated signal that has a plurality of positive pulses and a plurality of negative pulses as a function of the audio signal, then driving an H-bridge circuit interconnected to a speaker, wherein the H-bridge circuit comprises an A-side and a B-side, wherein the A-side comprises a first switching transistor and a second switching transistor, and wherein the B-side comprises a first switching transistor and a second switching transistor. For each positive pulse, the A-side of the H-bridge circuit is driven by pushing the first switching transistor of the A-side while grounding the second switching transistor of the A-side. For each negative pulse, the B-side of the H-bridge circuit is driven by pushing the first switching transistor of the B-side while grounding the second switching transistor of the B-side.

4 Claims, 2 Drawing Sheets

CLASS D AMPLIFIER WITH INCREASED EFFICIENCY

TECHNICAL FIELD

This invention relates to amplifiers for speakers, and in particular to a modified class D amplifier that drives a low fidelity speaker in a security system device.

BACKGROUND ART

In wireless security systems, power conservation in remote devices, such as keypads or key fobs, is an important requirement since they are typically battery powered. Recently, some remote devices have incorporated a speaker/microphone system so that the user can communicate with an operator at the central control station during an alarm situation. These remote device speakers can have audio quality similar to a public address system and therefore can use an amplifier that sacrifices fidelity for greater power conservation.

Class D amplifiers are typically used for speakers where power conservation is a requirement. The class D amplifiers use an H bridge driver circuit that has four switching elements each connected across the speaker. A pulse width modulation (PWM) audio signal drives two switches at a time, one that pushes the speaker and the other that pulls the speaker back to its origin (side A). When the PWM input signal changes polarity, the opposite two switches become operational with one switch pushing the speaker (in the direction opposite of side A) and the other switch pulling the speaker back to its origin (this is side B). Because the signals are comprised of pulses that have fixed amplitudes (but varying widths), the switching elements (usually MOSFETs) are switched either on or off rather than operated in their linear mode. This means that the only power dissipated by the transistors is during the interval between the on and off states. The class D amplifiers use very high switching frequencies that are typically greater than 100 KHz to achieve good fidelity with low distortion.

In the security industry there is always a need to further decrease the power consumption of the products and to further reduce the costs of the products. The present invention is an improved class D amplifier that accomplishes both these tasks. It also decreases the emission of electro-magnetic interference (EMI), which is an additional concern when designing security products.

It is therefore an object of the present invention to provide a class D amplifier with increased efficiency while providing acceptable sound quality for a speaker in a remote security device.

DISCLOSURE OF THE INVENTION

The present invention is a method of operating a speaker with a modified class D amplifier by converting an audio signal to a pulse-width modulated signal that has a plurality of positive pulses and a plurality of negative pulses as a function of the audio signal, then driving an H-bridge circuit interconnected to a speaker, wherein the H-bridge circuit comprises an A-side and a B-side, wherein the A-side comprises a first switching transistor and a second switching transistor, and wherein the B-side comprises a first switching transistor and a second switching transistor. For each positive pulse, the A-side of the H-bridge circuit is driven by pushing the first switching transistor of the A-side while grounding the second switching transistor of the A-side. For each negative pulse, the B-side of the H-bridge circuit is driven by pushing the first switching transistor of the B-side while grounding the second switching transistor of the B-side.

BEST MODE FOR CARRYING OUT THE INVENTION

Figure 1:
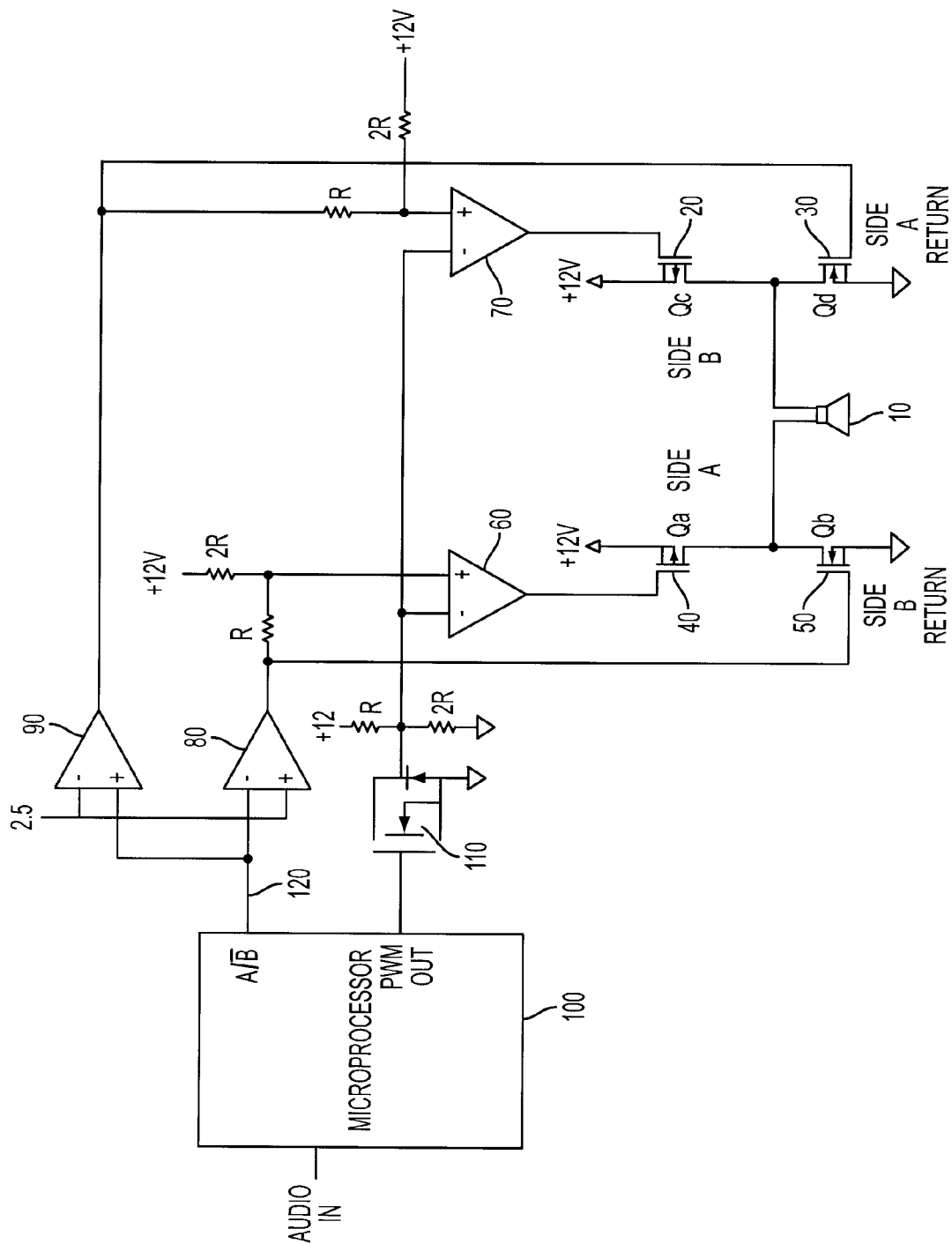
FIG. 1 is a diagram the circuitry of the present invention.
Figure 2:
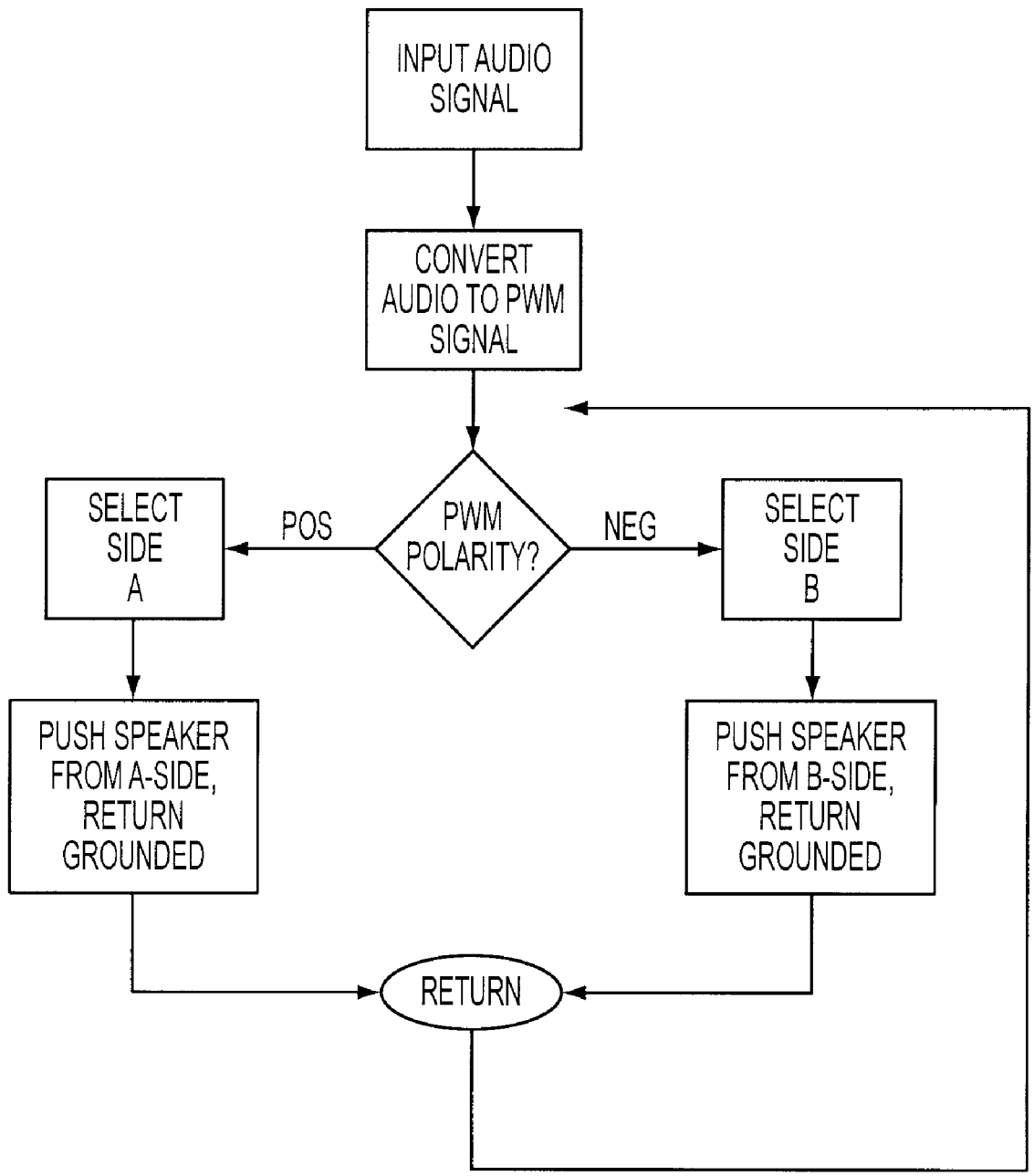
FIG. 2 is a flowchart of the operation of the present invention.

The preferred embodiments of the present invention will now be described with respect to the Figures. FIG. 1 shows a diagram of a speaker 10 driven by the enhanced class D amplifier of the present invention. Because a remote security device does not require a speaker with high fidelity, the class D amplifier of the present invention can have a switching rate that is 10 times less than the typical switching rate. This allows the class D amplifier of the present invention to be driven directly by a microprocessor 100. With further reference to FIG. 2, the microprocessor 100 receives an audio input signal and converts it to a pulse width modulated signal as well known in the art. Depending on the polarity of the PWM audio signal, the microprocessor 100 selects side A or side B using the A/B' signal 120 into the positive side of comparator 90 and the negative side of comparator 80, causing only one side to be selected at a time. When side A has been selected, the PWM signal from microprocessor 100 and MOSFET 110 is fed through comparator 60 and into switch 40. When side B has been selected by the microprocessor 100 the PWM signal is fed through comparator 70 and into switch 20. Side A of the H bridge driver uses switching element 40 to push the speaker 10 and side B uses switching element 20 to push the speaker 10 in the opposite direction. An important distinction between the present invention class D amplifier and the prior art class D amplifier is that the present invention class D amplifier does not pull the speaker back to its origin after it has been pushed. Consequently, the side A and B returns, which are switches 30 and 50 respectively, are connected to ground. The speaker does not need to be pulled back because of two reasons: first because it is operating at a much lower frequency than the prior art class D amplifiers, and second because sound quality can be sacrificed.

The power savings of this device is significant because the switching rate is 10 times less (saving 40 times the energy that is lost during the switching from on to off and off to on), there is no pulling of the speakers (saving the energy required for those circuits), and there is no cross conduction of the H bridge. Cross conduction occurs when the H bridge switches from pushing the speaker to pulling the speaker. Ideally, these actions would occur simultaneously with no overlapping energy being dissipated. In practice, however, world there are always delays because the circuit components are not ideal. These delays cause the pulling action to start while there is still pushing action taking place and the pushing action to start while there is still pulling action. These conflicting actions cause losses of energy through the switch elements. The present invention class D amplifier does not have conflicting actions and therefore has an increase in efficiency, which saves power. The design requires less complex parts, which saves cost, and a lower switching rate, which reduces EMI emissions.

It will be apparent to those skilled in the art that modifications to the specific embodiment described herein may be made while still being within the spirit and scope of the present invention. For example, the comparators 60, 70, 80, and 90 that are used to gate the signals into the H bridge may be different components which perform the same function, or the conversion of the audio signal to a PWM signal may be performed by discrete components rather than a microprocessor 100.

What is claimed is:

1. A method of operating a speaker comprising:
   a) converting an audio signal to a pulse-width modulated signal comprising a plurality of positive pulses and a plurality of negative pulses as a function of the audio signal;
   b) driving an H-bridge circuit interconnected to a speaker, wherein the H-bridge circuit comprises an A-side and a B-side, wherein the A-side comprises a first switching transistor and a second switching transistor, and wherein the B-side comprises a first switching transistor and a second switching transistor; comprising the steps of:
      i) driving, for each positive pulse, the A-side of the H-bridge circuit by pushing the first switching transistor of the A-side while grounding the second switching transistor of the A-side and grounding the first switching transistor of the B-side; and
      ii) driving, for each negative pulse, the B-side of the H-bridge circuit by pushing the first switching transistor of the B-side while grounding the second switching transistor of the B-side and grounding the first switching transistor of the A-side.

2. The method of claim 1 further comprising driving the speaker as a function of driving the A-side and the B-side of the H-bridge circuit.

3. The method of claim 1 further comprising receiving the audio signal from an associated security system component.

4. A circuit for driving a speaker comprising:
   a) a processor circuit adapted to convert an audio signal to a pulse-width modulated signal comprising a plurality of positive pulses and a plurality of negative pulses as a function of the audio signal;
   b) an H-bridge circuit interconnected to a speaker, wherein the H-bridge circuit comprises an A-side and a B-side, wherein the A-side comprises a first switching transistor and a second switching transistor, and wherein the B-side comprises a first switching transistor and a second switching transistor;
   c) first circuitry adapted to drive, for each positive pulse, the A-side of the H-bridge circuit by pushing the first switching transistor of the A-side while grounding the second switching transistor of the A-side and grounding the first switching transistor of the B-side; and
   d) second circuitry adapted to drive, for each negative pulse, the B-side of the H-bridge circuit by pushing the first switching transistor of the B-side while grounding the second switching transistor of the B-side and grounding the first switching transistor of the A-side.

* * * * *